United States Patent [19]
Kida et al.

[11] Patent Number: 4,758,525
[45] Date of Patent: Jul. 19, 1988

[54] METHOD OF MAKING LIGHT-RECEIVING DIODE

[75] Inventors: Yasuhiro Kida; Koichi Suda, both of Hitachi; Kunihiro Matsukuma, Taga; Keiichi Morita, Hitachi, all of Japan

[73] Assignee: Hitachi, Ltd., Tokyo, Japan

[21] Appl. No.: 884,894

[22] Filed: Jul. 14, 1986

[30] Foreign Application Priority Data

Jul. 15, 1985 [JP] Japan ................. 60-154024

[51] Int. Cl.[4] .............. H01L 21/385; H01L 21/40; H01L 21/425
[52] U.S. Cl. ........................... 437/2; 437/20; 437/134; 437/143; 437/152; 437/160
[58] Field of Search .............. 29/572, 576 B, 578; 357/19, 30; 147/788; 148/DIG. 83, DIG. 153; 437/143, 20, 160, 2, 152, 134

[56] References Cited

U.S. PATENT DOCUMENTS

| | | | |
|---|---|---|---|
| 3,436,282 | 4/1969 | Shoda | 357/30 F |
| 3,945,856 | 3/1976 | Koenig et al. | 437/28 |
| 4,029,518 | 6/1977 | Matsutani | 357/30 J |
| 4,131,488 | 12/1978 | Lesk et al. | 357/03 J |
| 4,152,824 | 5/1979 | Gonsiorawski | 29/572 |
| 4,426,234 | 1/1984 | Ohshima et al. | 29/576 B |
| 4,483,738 | 11/1984 | Blossfeld | 29/576 B |
| 4,505,023 | 3/1985 | Tscng et al. | 29/576 B |
| 4,616,247 | 10/1986 | Chang et al. | 357/30 |

OTHER PUBLICATIONS

Nakatani et al., *IEEE*, "A New Process for High Efficiency Silicon Solar Cells", 1984, pp. 1352-1356.
Muller, "Forming Buried Subcollectors by Ion Implantation", IBM TDB, vol. 19, No. 3, Aug. 76.
Nelson,"Ion Implantation," Science Journal, 3 No. 2 Feb. 1967.
Yang, "Fundamentals of Semiconductor Devices" McGraw Hill, 1978, pp. 73-77.
Gandhi, "ULSI Fabrication Principles," John-Wiley & Sons, pp. 300-301, 321-330.

*Primary Examiner*—George T. Ozaki
*Attorney, Agent, or Firm*—Antonelli, Terry & Wands

[57] ABSTRACT

In a method of manufacturing a solar cell including a p-n junction formed in a semiconductor substrate, impurity ions are implanted through a mask in the form of an oxide film covering a light receiving surface of the semiconductor substrate except an electrode forming part, thereby forming a p-n junction which is deep in an area beneath the electrode forming part but shallow in the remaining area. Formation of the shallow p-n junction improves the spectral sensitivity in a short wavelength range. Further, utilization of the oxide film as a passivation film can prevent shortening of the life time of minority carriers in the substrate due to heat treatment, thereby retarding the electron-hole recombination rate at the light receiving surface of the substrate.

18 Claims, 5 Drawing Sheets

METHOD OF MAKING LIGHT-RECEIVING DIODE

BACKGROUND OF THE INVENTION

This invention relates to a photodiode, and more particularly to a method of manufacturing a photodiode having a light-receiving shallow p-n junction.

The term "photodiode" is used in this specification to mean a light-receiving diode and includes a solar cell. A semiconductor photodiode includes a p-n junction in the neighborhood of its light receiving surface. Light incident on the light receiving surface of the semiconductor photodiode is partly reflected by the light receiving surface, but the remainder penetrates into the semiconductor substrate. The semiconductor substrate has an absorption coefficient which is a function of the wavelength of the light, and the incident light is absorbed according to the absorption coefficient. Therefore, the intensity of the light incident on the surface of the semiconductor substrate is exponentially attenuated toward the interior of the semiconductor substrate. Further, the absorption coefficient is larger for light of short wavelengths, i.e. high energy, than for light of long wavelengths. Therefore, the light of short wavelengths is attenuated faster than the light of other wavelengths. Absorption of light having energy higher than the band width causes generation of electron-hole pairs. Besides diffusion, photoexcited carriers migrate due to, for example, drift attributable to the presence of a built-in electric field. When the holes (electrons) reach the anode (cathode) as a result of migration, photoexcited current can be obtained. However, no electric power can be derived from the semiconductor photodiode to the exterior when recombination of the holes and electrons occurs in the midway of their migration.

Considering the exponential attenuation of the intensity of incident light from the surface of the semiconductor substrate toward the interior of the semiconductor substrate, the p-n junction is preferably formed in the neighborhood of the semiconductor substrate surface (that is, as shallow as possible).

The mechanism of recombination determining the life time of the carriers is roughly classified into surface recombination and bulk recombination. Both the former and the latter contribute to the recombination of the holes and electrons in the neighborhood of the light receiving surface of the semiconductor substrate, while the latter contributes mainly to the hole-electron recombination inside the semiconductor substrate.

The p-n junction is preferably as shallow as possible in order that light (especially, light of short wavelengths) can be efficiently converted into a photoexcited current. Generally, in the case of a solar cell of silicon, the depth of the p-n junction is preferably from 0.3 $\mu$m to 0.4 $\mu$m.

An electrode is required to derive the photoexcited current to the exterior from the semiconductor photodiode. This electrode is commonly formed by application (deposition, printing, etc.) of an electrode material to a predetermined region of the semiconductor substrate and by subsequent heat treatment. In this case, inversion and alloying (including a silicide reaction) tend to occur in the semiconductor surface layer beneath the electrode. In order that the electrode showing satisfactory electrical properties can be formed on the semiconductor surface layer, the semiconductor surface layer has preferably a low sheet resistance and/or a sufficient thickness. Since the portion of the p-n junction beneath the light receiving surface is preferably as shallow as possible as described above, the general profile of the p-n junction would preferably be such that it has a locally changing depth. The region where the electrode is to be formed on the semiconductor substrate surface will be referred to hereinafter as an electrode forming part.

Unexamined Japanese Patent (Laid-Open) Publication No. 59-79580 proposes a method of manufacturing a photodiode comprising the steps of vapor-phase diffusing an impurity into a semiconductor substrate, patterning an oxide film formed subsequently and including the impurity to leave the oxide film only on an electrode forming part, and, then subjecting it to heat treatment, thereby driving in the impurity. The impurity diffuses more from the portion having the remaining oxide film, thereby forming a p-n junction whose depth changes locally and which is deeper at the electrode forming part than at the light receiving part.

According to the proposed method, two steps of impurity doping are required, and a patterning step between these two steps is also required.

Therefore, a method of manufacturing a high-efficiency photodiode by simplified steps is demanded.

SUMMARY OF THE INVENTION

It is an object of the present invention to provide a method of manufacturing, by simple steps, a photodiode in which an impurity doped region formed in a surface layer of a substrate has a low sheet resistance at an electrode forming part and a high sheet resistance at a light receiving part.

Another object of the present invention is to provide a method of manufacturing, by simple steps, a photodiode in which an impurity doped region formed in a surface layer of a substrate defines a p-n junction which is deeper at an electrode forming part and shallower at a light receiving part.

In accordance with one aspect of the present invention, there is provided a method of manufacturing a photodiode comprising the steps of forming an oxide film on a surface of a semiconductor substrate, patterning the oxide film to leave a light receiving part, and implanting impurity ions having a conductivity type opposite to that of the semiconductor substrate into the semiconductor substrate through the patterned oxide film.

By the ion implantation through the patterned oxide film, the electrode forming part exposed through the window of the masking oxide film has a low sheet resistance, and the light receiving part beneath the masking oxide film has a higher sheet resistivity.

Also, by the ion implantation through the patterned oxide film, a p-n junction is formed which is deeper beneath the electrode forming part exposed through the window of the masking oxide film than beneath the light receiving part beneath the masking oxide film.

The oxide film may be such that the masking portion exhibits a greater decelerating function against the implanted ions than the window portion. The window portion may be provided by a thinner oxide film, and the masking portion may be provided by a thicker oxide film.

Further, this oxide film can be utilized as a contamination preventive film preventing contamination during heat treatment and also as a passivation film for reducing the surface recombination rate at the light receiving surface of the photodiode. Utilization of the oxide film for such purposes is especially effective when solar cells are produced by the use of a belt furnace suitable for mass production.

BRIEF DESCRIPTION OF THE DRAWINGS

FIGS. 2A and 2B illustrate the function of a mask used for ion implantation, in which FIG. 2A is a graph showing the distribution of implanted ions, and FIG. 2B is a graph showing how the sheet resistance changes relative to the oxide film thickness.

FIGS. 3A, 3B and 3C illustrate how to manufacture a solar cell according to a second embodiment of the present invention, in which FIGS. 3A and 3C are schematic sectional views of a semiconductor substrate before and after heat treatment respectively, and FIG. 3B is a partly elevational sectional, side view of a belt furnace used for the heat treatment.

DESCRIPTION OF THE PREFERRED EMBODIMENTS

It is effective for the purpose of producing a high-efficiency photodiode to optimize the depth of a p-n junction and to prevent an undesirable shortening of the life time of minority carriers.

A surface of a p-type semiconductor substrate was doped with an n+-type impurity, and light was directed toward the n+-type surface layer of the substrate. An experiment was conducted in which the diffusion distances of minority carriers were $L_n = 150$ μm and $L_P = 1$ μm, the diffusion constants of minority carriers were $D_n = 25$ cm$^2$/sec and $D_p = 1$ cm$^2$/sec, the thickness of the p-type substrate was 400 μm, and the thickness of the n+-type layer was changed as a variable.

Figure 5:
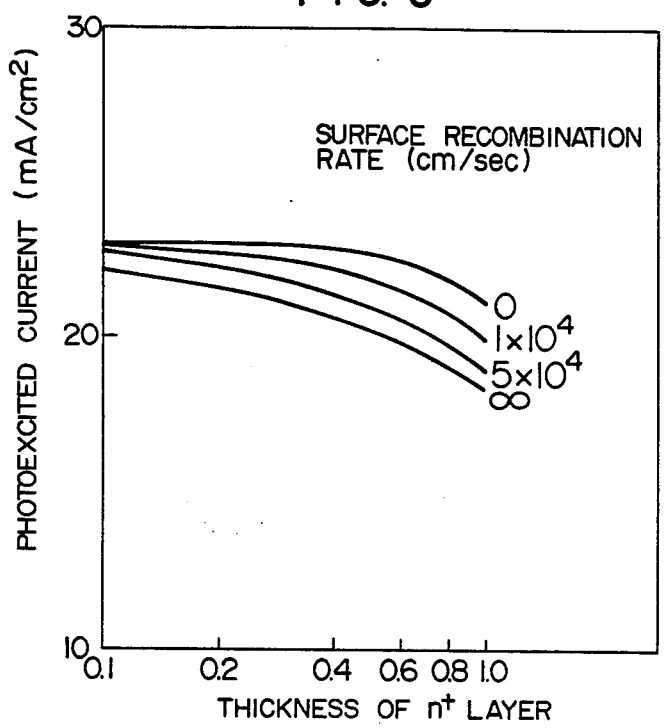
FIG. 5 is a plot showing the results of calculation of changes of the value of photoexcited current relative to the thickness of an n+-type region formed on a surface of a p-type substrate.

FIG. 5 shows the results of calculation of changes of the value of a photoexcited current relative to the thickness of the n+-type layer, when the surface recombination rate is taken as a parameter. It will be seen in FIG. 5 that the intensity of the photoexcited current decreases with the increase of the thickness of the n+-type layer. That is, as the depth of the p-n junction increases, minority carriers generated by incident light, especially, light of short wavelengths recombine more multitudinously at the light receiving surface of the substrate and cannot reach the p-n junction, resulting in a reduced intensity of the photoexcited current. Therefore, a junction depth of from 0.3 μm to 0.4 μm is generally preferable.

On the other hand, it is necessary to form an electrode on the surface region, too. A metal (or a metal paste) is deposited on the semiconductor substrate surface as by vacuum evaporation or printing and is then heat-treated to provide an electrode having a low resistance. In the step of heat treatment, there occurs an alloying reaction, a silicide reaction or the like between the electrode metal and the semiconductor. When the electrode is formed on the thin surface region, the surface region may be damaged in the step of heat treatment, tending to give rise to trouble such as a short-circuit.

It is preferable, therefore, to dope the electrode forming part deep with the impurity of a larger quantity, but to dope the light receiving part shallow with the impurity of a smaller quantity. For this purpose, it is effective to utilize a mask in the form of an oxide film.

Figure 6:
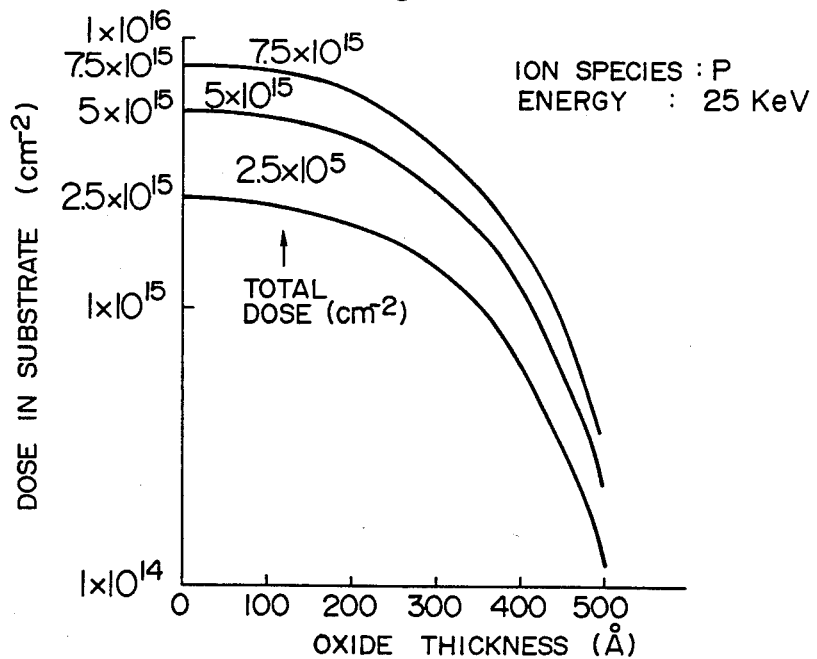
FIG. 6 is a plot showing the results of calculation of changes of the quantity of ions implanted into the substrate relative to the thickness of an oxide film.

FIG. 6 shows the results of calculation of changes of the quantity of ions implanted into the substrate through an oxide film, relative to the thickness of the oxide film. When an oxide film having a controlled thickness is provided on the light receiving part, the surface region having a high impurity concentration at the electrode forming part and a desired impurity concentration at the light receiving part can be formed by merely implanting impurity ions once. After activation, a deep p-n junction having a low sheet resistivity and a shallow p-n junction having a desired sheet resistivity can be formed beneath the electrode forming part and light receiving part of the photodiode, respectively.

The life time of minority carriers is governed by the recombination rate. The life time is preferably as long as possible in order that the photoexcited carriers can be taken out to the exterior. An impurity such as a heavy metal provides one of sources giving rise to the mechanism of recombination. It is therefore necessary to prevent, as much as possible, contamination with such an impurity which will shorten the life time during the production process.

Figure 7:
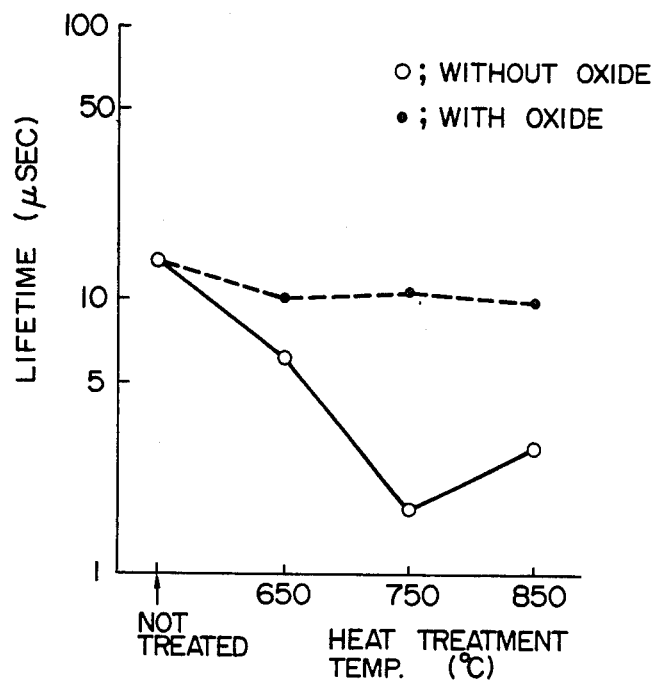
FIG. 7 is a graph showing the results of measurement of changes of the life time depending on the presence or absence of the oxide film during heat treatment.

In a low-cost process, a consistent and continuous production system is essentially required. In such a production system, a belt furnace is used for the heat treatment, but shortening of the life time of carriers in a substrate by contamination from, for example, the belt of the belt furnace poses an important problem. Prevention of the undesirable shortening of the life time in the substrate can be expected by protecting the substrate surface during the period of heat treatment. FIG. 7 shows the results of measurement of changes of the life time in the substrate depending on whether the substrate surface was covered with an oxide film or not during the step of heat treatment. Here, the oxide film is removed after the heat treatment. In FIG. 7, samples heat-treated in a state in which the ion implanted surface is exposed are labeled "without oxide film", while samples heat-treated in a state in which the ion implanted surface is covered with an oxide film which is removed later, are labeled "with oxide film." It has been confirmed that the life time of the substrate heat-treated in the state of "with oxide film" is not shortened by the heat treatment, and the oxide film covering the substrate surface functions effectively as a contamination preventive film during the step of heat treatment.

It has also been found that the surface recombination rate of carriers is very small when the substrate surface is being covered with the oxide film than when the surface is exposed.

Figure 1A:
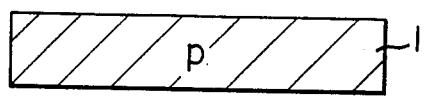
FIGS. 1A to 1H are schematic sectional views of a semiconductor substrate for illustrating how to manufacture a solar cell according to a first embodiment of the present invention.
Figure 1B:
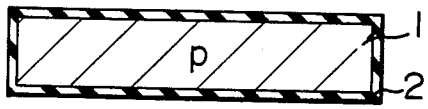
Figure 1C:
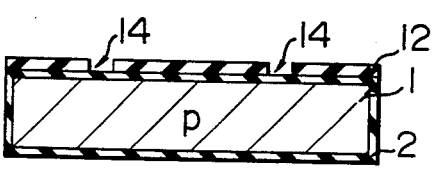
Figure 1D:
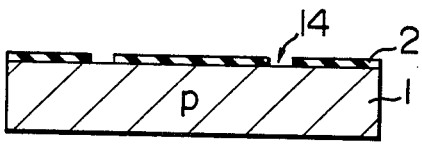

FIGS. 1A to 1H are schematic sectional views of a semiconductor substrate for illustrating how to manufacture a photodiode according to a first embodiment of the present invention. In FIG. 1A, there is shown a p-type substrate in which an n-type surface layer 3 is formed. Here, it will be obvious that the conductivity types may be reversed. It is desirable that this p-type substrate 1 has a high resistivity and a long life time of minority carriers. When the material of the p-type substrate 1 is silicon, the impurity concentration is preferably from $1 \times 10^{15}/cm^3$ to $1 \times 10^{17}/cm^3$, and more preferably from $2 \times 10^{15}/cm^3$ to $5 \times 10^{16}/cm^3$. After cleaning the entire surfaces of the substrate 1, an oxide film 2 having a thickness of from 100 Å to 150 Å is caused to grow on the entire substrate surfaces in a dry oxidizing atmosphere (FIG. 1B). Such an oxide film 2 may be formed by another method, for example, a method of wet oxidization or a method of chemical vapor deposition (CVD). In the case where the CVD method is employed, no oxide film is formed on the lower or rear surface of the substrate 1. Then, an acid-resistive etching resist film 12 is printed on the oxide film 2 covering the upper or front surface of the substrate 1 (FIG. 1C). This etching resist film 12 covers a light receiving part of the front surface of the substrate 1 and has a window (opening) 14 at a position corresponding to an electrode forming part. The substrate 1 printed with the etching resist film 12 is treated with an etching solution consisting of $HF: H_2O = 1:10$ to remove the exposed portion of the oxide film 2. Then, when the etching resist film 12 is also removed, a structure having the oxide film pattern 2 having a window 14 on the light receiving part is obtained as shown in FIG. 1D.

Figure 1E:
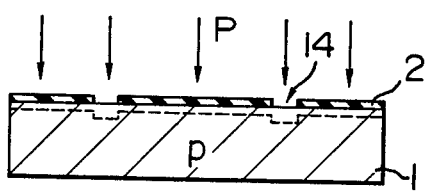
Figure 1F:
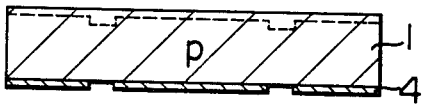

Then, impurity ions are implanted into the substrate surface having the oxide film pattern 2 as shown in FIG. 1E. Ions of phosphorus (P) are used herein and implanted through the oxide film pattern 2 with an acceleration energy of 25 KeV and in a dose of $5 \times 10^{15}/cm^2$. At the window 14 of the oxide film pattern 2, the impurity ions are directly implanted into the substrate 1. Therefore, the quantity of implanted ions is large, and the depth of ion implantation is relatively large at the area of the window 14. At the area covered with the oxide film 2, the impurity ions are decelerated by the oxide film 2 and are partly lost. Therefore, at this covered area, the quantity of ions implanted into the substrate 1 is small, and the depth of ion implantation is also small. The overall depth of ion implantation is shown by the broken line in FIG. 1E. When the implanted phosphorus ions are then electrically activated, relative sheet resistances corresponding to the implanted dose quantities are exhibited.

Figure 1G:
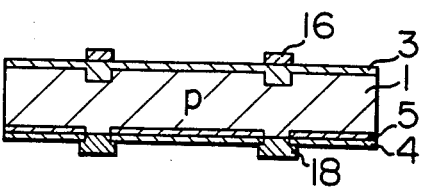

Then, the oxide-film etching solution consisting of $HF: H_2O = 1:10$ is applied to remove the entirety of the remaining oxide film 2, and an aluminum (Al) paste pattern 4 is printed on the rear surface of the substrate 1 (FIG. 1F), so as to provide a low-resistance contact on the rear surface of the substrate 1 utilizing the heat treatment applied for activating the implanted ions. In order to facilitate later deposition of an electrode, the Al paste pattern 4 is not printed on the entire rear surface of the substrate 1 to expose part of the semiconductor surface. The structure having the Al paste pattern 4 printed on the rear surface is heated at about 850° C. for about 5 minutes. By this step of heating, the ions implanted from the front surface of the structure are activated, and crystal damages resulting from the ion implantation is recovered to form an n+-type region 3 in the front surface of the structure. On the rear-surface side of the structure, the Al paste pattern 4 is baked to form a p+-type region 5 due to diffusion of aluminum into the rear surface of the structure. Then, silver (Ag) paste electrodes 16 and 18 of comb-like shape are provided on the front and rear surfaces respectively of the structure and are heated at about 600° C. for about 8 minutes to bake the Ag paste (FIG. 1G). On the rear-surface side of the structure, the Ag paste deposited on the exposed portion of the substrate 1 provides required physical strength. When so required, the structure is dipped in a solder bath to provide solder layers 17 and 19 on the electrodes 16 and 18 respectively. An anti-reflection film 20 may be provided on the front surface of the structure before the step of dipping in the solder bath. The n+-type region 3 formed in the front surface of the structure has a low sheet resistance and a large depth beneath the electrodes 16 and 17, thereby effectively preventing a short-circuit between the electrode 16 and the p-type region 1.

Figure 2A:
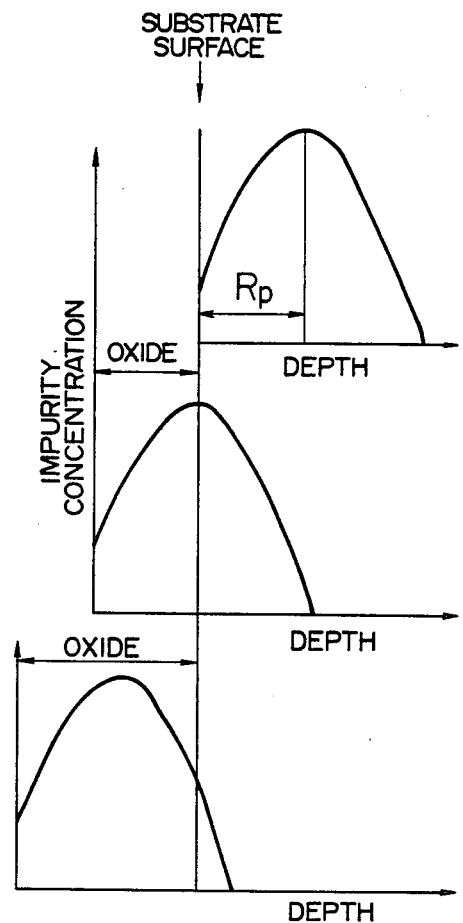

FIG. 2A is a graph illustrating the concept of the present invention. In FIG. 2A, the horizontal axis represents the depth from the front surface of the substrate and the thickness of the oxide film formed on the substrate surface, and the vertical axis represents the distribution of the implanted impurity concentration. The uppermost distribution profile corresponds to the case where the oxide mask is not provided on the substrate surface. In such a case, the implanted ions are distributed on both sides of the depth of the peak range $R_P$ of ions implanted from the substrate surface. The ion implantation through the window (the electrode forming part) corresponds to the uppermost distribution profile. When the oxide film mask is present, the implanted impurity distribution starts from the surface of the oxide film. Thus, when only the interior of the semiconductor substrate is considered, the implanted impurity distribution shifts leftward in FIG. 2A. The intermediate distribution profile represents schematically the case where the thickness of the oxide film is exactly equal to the peak range $R_P$. It will be seen that the impurity concentration is highest at the semiconductor surface and progressively decreases toward the interior of the substrate. The intermediate distribution profile is analogous to the distribution in a diffused region in that the impurity concentration is high at the substrate surface, but shows a sharp contrast with the distribution in the diffused region in that the distribution decreases sharply toward the tail of the profile. The lowermost distribution profile represents the case where the mask has a larger thickness. It will be seen that the impurity concentration decreases sharply as the depth (whatever small) increases from the substrate surface. In the present invention, the thickness of the oxide film is preferably selected to be larger than the peak range $R_P$ of implanted ions, so as to form a shallow p-n junction beneath the light receiving surface of the substrate. That is, while ensuring a low sheet resistance at the electrode forming part, a p-n junction having the desired depth can be provided. The sharp attenuation of the impurity concentration distribution can also be effectively utilized. Further, it will be obvious that materials other than the oxide film can be used to provide the mask.

At the light receiving part where the oxide film is present, the impurity concentration distribution obtained under the aforementioned conditions of ion implantation is considered to correspond to the lowermost distribution profile shown in FIG. 2A.

Figure 2B:
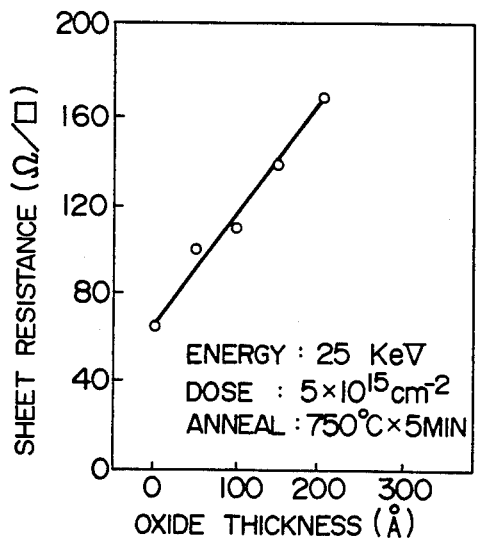

FIG. 2B shows how the sheet resistance changes relative to the thickness of the oxide film. The sheet resistance was measured after implanting phosphorus ions into a p-type silicon substrate in a dose of $5\times10^{15}/cm^2$ with an implantation energy of 25 KeV and then annealing the substrate at 750° C. for about 5 minutes. The sheet resistance changed generally linearly relative to the thickness of the oxide film. The sheet resistance was about 60 Ω/□ when the oxide film was not present. The sheet resistance was almost doubled when the thickness of the oxide film was about 100 Å. The sheet resistance was about 170 Ω/□ when the thickness of the oxide film was about 200 Å.

The oxide film used as the mask at the time of ion implantation can be used as a passivation film for preventing contamination.

Figure 3A:
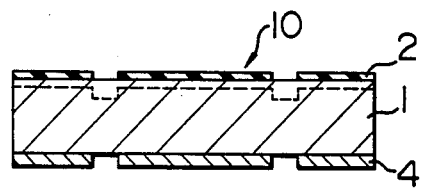

FIG. 3A shows a semiconductor chip 10 on the rear surface of which an Al paste electrode 4 is printed in a state in which the other or front surface of the chip 10 is covered with an oxide film 2. The ion-implanted layer is not yet activated.

Figure 3C:
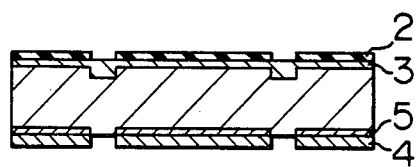
Figure 3B:
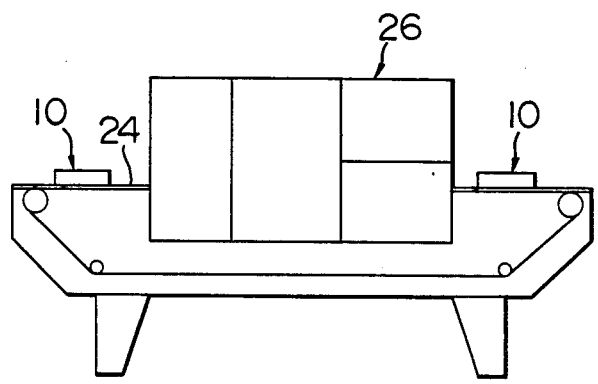

FIG. 3B shows a belt furnace used for heat treatment. A semiconductor chip 10 as shown in FIG. 3A is placed on a conveyor belt 24 to be conveyed through the furnace 26. The internal temperature of the furnace 26 is set at, for example, 850° C., and the period of time of passage through the furnace 26 is set at, for example, about 5 minutes. Under the above conditions, activation and damage recovery of the chip 10 after the step of ion implantation are attained together with baking of the Al paste electrode 4. Although an impurity may be liberated from the belt 24 at such a high temperature, the oxide film 2 acts effectively as a passivation film.

Figure 1H:
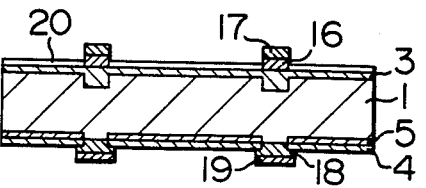

After the step of heat treatment, an etching resist is printed on the entire rear surface of the chip 10, and the oxide film 2 is removed by application of an oxide film etchant consisting of HF: $H_2O=1:10$. After removing the etching resist, an Ag paste electrode is printed and baked to provide the structure shown in FIG. 1G. Then, when so required, a solder layer is deposited on the Ag paste electrode (FIG. 1H).

Figure 4:
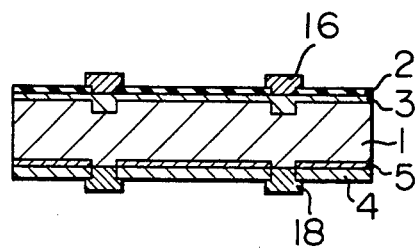
FIG. 4 is a schematic sectional view of a semiconductor substrate for illustrating a third embodiment of the present invention.

The oxide film used as the mask in the step of ion implantation may be left intact to act as a passivation film. When an oxide film about 100 Å thick was formed on a substrate, in which the life time of minority carriers was from 4 μsec to 6 μsec in the absence of any oxide film, the life time was extended to about 110 μsec. FIG. 4 shows a solar cell in which electrodes 16 and 18 are formed on a substrate having an oxide film as shown in FIG. 3C.

A solar cell was made as a comparative sample in which a flat p-n junction was formed by ion implantation without the use of an oxide mask. The characteristics of this comparative sample was compared with those corresponding to the solar cells shown in FIG. 1H and FIG. 4. Those solar cells are not provided with the anti-reflection (AR) coating. The results are shown in the following table:

|  | Short-circuit current density (mA/cm²) | Open circuit voltage (V) | Curve factor | Conversion efficiency |
| --- | --- | --- | --- | --- |
| Comparative sample | 22.4 | 0.555 | 0.788 | 9.8 |
| Embodiment (FIG. 1H) | 23.3 | 0.565 | 0.779 | 10.3 |
| Embodiment | 24.0 | 0.570 | 0.780 | 10.7 |

-continued

|  | Short-circuit current density (mA/cm²) | Open circuit voltage (V) | Curve factor | Conversion efficiency |
| --- | --- | --- | --- | --- |
| (FIG. 4) |  |  |  |  |

(Without AR coating)

It can be seen from the above table that the shortcircuit current density and open circuit voltage are increased, and the conversion efficiency is improved according to the present invention.

We claim:

1. A method of manufacturing a light-receiving diode comprising the steps of:
   (a) forming on one principal surface, of a pair of principal surfaces of a semiconductor substrate of a first conductivity type, an oxide film having a window at an electrode forming part;
   (b) implanting impurity ions of a second conductivity type into said one principal surface through said oxide film;
   (c) selectively forming a layer of aluminum on the other principal surface, of the pair of prinicpal surfaces of the semiconductor substrate; and
   (d) heat-treating (1) said substrate to activate the implanted ions in the one principal surface, thereby producing an impurity-doped region having a low sheet resistance at said electrode forming part but having a relatively high sheet resistance at the remaining part, and (2) the layer of aluminum on the other principal surface of the substrate to diffuse aluminum into the other principal surface.

2. A method as claimed in claim 1, further comprising the step of depositing an electrode on said impurity-doped region through the window of said oxide film formed in said step (a).

3. A method as claimed in claim 1, wherein the aluminum is diffused into the other principal surface so as to produce a region of the first conductivity type in the substrate having a higher impurity concentration than that of said substrate.

4. A method as claimed in claim 1, wherein said heat-treating sid substrate and said heat-treating the layer of aluminum is performed in a signle step, whereby the activation of the implanted ions in the one principal surface and the diffusion of aluminum into the other principal surface are performed simultaneously.

5. A method as claimed in claim 1, wherein the selective forming of a layer of aluminum is a selective forming of a layer of aluminum paste, the heat-treating of the layer of aluminum being a heat-treating of the layer of aluminum paste so as to bake the aluminum paste and diffuse aluminum into the other principal surface.

6. A method as claimed in claim 5, wherein said heat-treating said substrate and said heat-treating the layer of aluminum paste is performed in a single step, whereby the activation of the implanted ions in the one principal surface and the diffusion of aluminum into the other principal surface are performed simultaneously.

7. A method as claimed in claim 5, wherein said aluminum paste layer has a window for enhancing contact of an electrode to be formed thereafter.

8. A method as claimed in claim 7, further comprising the step of forming a pattern of silver paste on the other principal surface of the heat-treated substrate.

9. A method as claimed in claim 1, wherein said oxide film is retained on said semiconductor substrate during the heat-treating, the oxide film acting as a passivation film.

10. A method as claimed in claim 9, wherein said oxide film has a thickness of about 100 Å.

11. A method as claimed in claim 1, wherein said heat-treating step includes conveying the substrate on a belt through a furnace.

12. A method of manufacturing a light-receiving diode comprising the steps of:
  (a) forming, on one principal surface of a pair of principal surfaces of a semiconductor substrate of a first conductivity type, an oxide film having a window at an electrode forming part;
  (b) implanting impurity ions of a second conductivity type into said one principal surface through said oxide film;
  (c) selectively forming a layer of aluminum on the other principal surface of the pair of principal surfaces; and
  (d) heat-treating said substrate to activate the implanted ions, thereby forming a pn-junction which is deep beneath said electrode forming part but shallow beneath the remaining part, and to diffuse aluminum into the other principal surface.

13. A method as claimed in claim 12, further comprising the step of depositing an electrode on said impurity-doped region through the window of said oxide film formed in said step (a).

14. A method as claimed in claim 12, wherein the layer of aluminum is a layer of aluminum paste.

15. A method as claimed in claim 14, wherein the heat-treating is a single step, whereby the activation of the implanted ions and diffusion of aluminum are performed simultaneously.

16. A method of manufacturing a light-receiving diode comprising the steps of:
  (a) forming, on one principal surface of a pair of principal surfaces of a semiconductor substrate of a first conductivity type, a film having a window at an electrode forming part and exerting a retarding action to implanting ions;
  (b) implanting impurity ions of a second conductivity type into said one principal surface through said film;
  (c) selectively forming a layer of aluminum on the other principal surface of the pair of principal surfaces; and
  (d) heat-treating said substrate to activate the ions implanted into said one principal surface, thereby producing an impurity-doped region having a lower sheet resistance and a deeper depth at said electrode forming part than at the remaining part, and to diffuse aluminum to form an aluminum-doped region in the other principal surface.

17. A method as claimed in claim 16, wherein the layer of aluminum is a layer of aluminum paste.

18. A method as claimed in claim 17, wherein the heat-treating is a single step, whereby the activation of the implanted ions and diffusion of aluminum are performed simultaneously.

* * * * *